(12) United States Patent
Langer et al.

(10) Patent No.: US 8,938,205 B2
(45) Date of Patent: *Jan. 20, 2015

(54) PA BIAS OPTIMIZATION FOR MODULATION SCHEMES WITH VARIABLE BANDWIDTH

(71) Applicant: Intel Mobile Communications GmbH, Neubiberg (DE)

(72) Inventors: Andreas Langer, Unterschleissheim (DE); Christoph Hepp, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/179,861

(22) Filed: Feb. 13, 2014

(65) Prior Publication Data

US 2014/0162578 A1 Jun. 12, 2014

Related U.S. Application Data

(63) Continuation of application No. 12/882,544, filed on Sep. 15, 2010, now Pat. No. 8,655,293.

(51) Int. Cl.
*H01Q 11/12* (2006.01)
*H04B 1/04* (2006.01)

(52) U.S. Cl.
CPC ............ *H04B 1/04* (2013.01); *H04B 2001/045* (2013.01)
USPC ..................... 455/127.2; 455/103; 455/114.3; 455/127.1

(58) Field of Classification Search
USPC ...................................................... 455/127.2
See application file for complete search history.

(56) References Cited

U.S. PATENT DOCUMENTS

| 5,912,926 | A | * | 6/1999 | Koenck et al. ................ 375/295 |
| 6,157,253 | A | | 12/2000 | Sigmon et al. |
| 7,123,889 | B2 | | 10/2006 | Scheck et al. |
| 7,315,211 | B1 | | 1/2008 | Lee et al. |
| 2004/0213335 | A1 | | 10/2004 | Forest et al. |
| 2005/0135502 | A1 | | 6/2005 | Zhang et al. |
| 2006/0116087 | A1 | | 6/2006 | Sugar et al. |
| 2008/0171523 | A1 | * | 7/2008 | Anderson et al. .......... 455/127.1 |
| 2009/0088093 | A1 | | 4/2009 | Nentwig |
| 2010/0091900 | A1 | * | 4/2010 | Gan ............................. 375/267 |
| 2010/0227577 | A1 | * | 9/2010 | Zeong et al. ............... 455/127.2 |

(Continued)

FOREIGN PATENT DOCUMENTS

WO 2008079454 A1 7/2008

OTHER PUBLICATIONS

International Search Report dated Mar. 2, 2012 for PCT Application No. PCT/IB2011/002750. 12 Pages.

(Continued)

*Primary Examiner* — Ajibola Akinyemi
(74) *Attorney, Agent, or Firm* — Eschweiler & Associates, LLC (57) ABSTRACT

The disclosure relates to a method for improving the power consumption of a transmission chain by varying the operating point of a power amplifier to optimize (e.g., reduce) the current that is consumed by the amplifier. The operating point is varied by changing the bias voltage(s) (e.g., supply voltage, quiescent voltage) of the amplifier to a predetermined value that is chosen based upon the effect that a given transmitted signal modulation scheme characteristic (e.g., channel bandwidth and/or number of subcarriers) has on the operating point of a power amplifier.

20 Claims, 5 Drawing Sheets

(56) References Cited

U.S. PATENT DOCUMENTS

2010/0232413 A1* 9/2010 Dakshinamurthy et al. .. 370/343
2010/0321108 A1 12/2010 Lee et al.

OTHER PUBLICATIONS

Non-Final Office Action dated May 24, 2012 for U.S. Appl. No. 12/882,544. 35 Pages.

Non-Final Office Action dated Dec. 21, 2012 for U.S. Appl. No. 12/882,544. 22 Pages.

Non-Final Office Action dated Jun. 28, 2013 for U.S. Appl. No. 12/882,544. 15 Pages.

Notice of Allowance dated Oct. 9, 2013 for U.S. Appl. No. 12/882,544. 19 Pages.

* cited by examiner

PA BIAS OPTIMIZATION FOR MODULATION SCHEMES WITH VARIABLE BANDWIDTH

REFERENCE TO RELATED APPLICATION

This application is a continuation of U.S. application Ser. No. 12/882,544 filed on Sep. 15, 2010.

FIELD OF INVENTION

The present invention relates generally to a power-efficient transmitter and more particularly to a power efficient transmitter configured to optimize power amplifier operation.

BACKGROUND OF THE INVENTION

The functionality of wireless communication devices has rapidly developed over the past decade. Today's wireless communication devices offer applications that require the transmission of large amounts of data over extended periods of time. For example, PDA's and smart phones commonly use mobile broadband to allow users to run applications such as email, internet browsing, internet TV, etc. The large data transfer rates used by today's wireless communication devices are demanding on the communication devices and therefore require increasingly complex transmission systems.

In general, to reduce the power consumption such complex transmission systems rely upon a system architecture in which a low power signal is output from a transmitter chain to a power amplifier. The power amplifier is configured to increase the power of the signal before providing it to an antenna for transmission. By using a low power signal throughout the modulation process power consumption throughout the transmitter chain can be reduced.

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

Power consumption is an important design concern for modern mobile communication devices since low power consumption allows for increased performance, improved functionality, and longer operation time. In mobile communication devices the current used in transmission chains comprises a large source of power consumption. Within a typical transmission chain a plurality of modulation elements are configured to modulate and to output a low power signal to a power amplifier that increases the output power of the low power signal. Because the modulation elements operate to produce a low power signal and because the power amplifier is configured to increase the output power of the signal, the power amplifier is a main source of power consumption in a transmitter. Accordingly, a method and apparatus for decreasing the current consumption of a power amplifier is provided herein.

The inventors have appreciated that characteristics of a transmitted signal's modulation scheme have an effect on the current consumption of a power amplifier. For example, the channel bandwidth and number of subcarriers (e.g., or resource blocks) used by a transmission chain to transmit a signal have an effect on the current consumption of a power amplifier in the transmission chain for variable bandwidth modulation schemes. Based upon this appreciation, inventors have disclosed a method and apparatus to reduce current consumption and thereby improve the power consumption of a transmitter/transceiver by changing the bias voltage(s) (e.g., supply voltage, quiescent voltage, etc.) of a power amplifier comprised therein.

In particular, the method and apparatus improve the power consumption of a transmission chain by varying the operating point of a power amplifier to optimize (e.g., reduce) the current that is consumed by the amplifier. The operating point is varied by changing the bias voltage(s) (e.g., supply voltage, quiescent voltage) of the amplifier to a predetermined value that is chosen based upon the effect that a given transmitted signal modulation scheme characteristic (e.g., channel bandwidth and/or number of subcarriers) has on the operating point of a power amplifier.

For example, if the one or more characteristics indicate a good power amplifier performance the maximum linear output power capability of a power amplifier can be lowered, by changing the bias voltage supplied to the power amplifier, to reduce the output power capability and current consumption. Therefore, one or more bias voltage(s) having predetermined values may be provided to a power amplifier to result in an operating point that optimizes (e.g., reduces) the current consumption, and therefore the power consumption, of a power amplifier.

Figure 1:
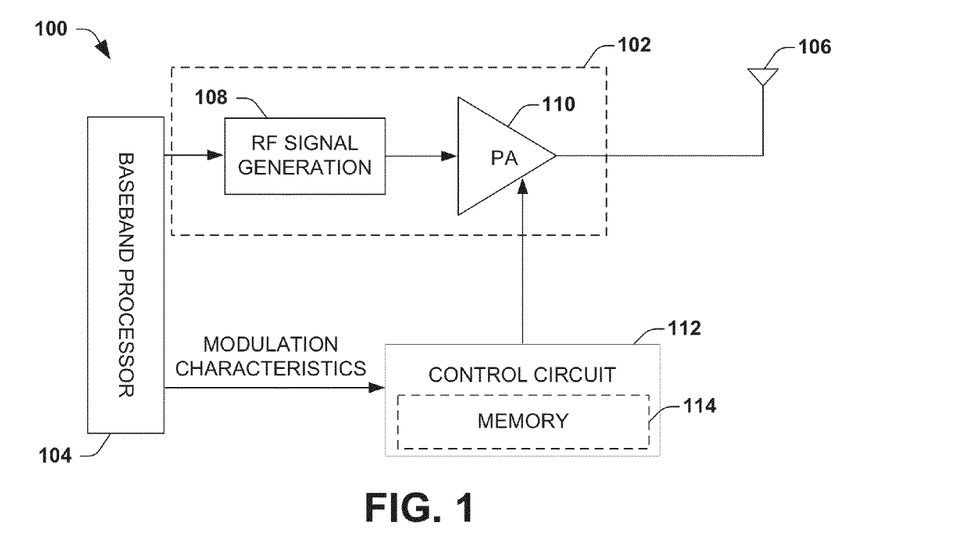
FIG. 1 illustrates a block diagram of a first embodiment of a transmitter circuit configured to change a bias voltage(s) to a predetermined value calculated to optimize the power amplifier current consumption.

FIG. 1 illustrates a block diagram of a first embodiment of a transmitter circuit 100 configured to change one or more bias voltage(s) (e.g., supply voltage, quiescent voltage, etc.) to a predetermined value calculated to optimize the power amplifier current consumption based upon one or more characteristics of a transmitted signal's modulation scheme (e.g., comprising a bandwidth and/or number of subcarriers used to transmit a signal). The transmitter 100 comprises a first signal path and a second signal path. The first signal path is configured to produce a modulated signal that is provided to an antenna 106 for transmission (i.e., a transmitted signal). The second signal path is configured to produce one or more bias voltage(s) based upon characteristics of the transmitted signal used in the first signal path (e.g., a number of subcarriers/resource blocks which determine the instantaneous effective bandwidth of the modulation scheme, channel bandwidth which determines the maximum bandwidth) and to provide the one or more bias voltage(s) to a power amplifier in the first signal path.

More particularly, in the first signal path a transmission chain 102 is disposed between a signal generator 104 (e.g., baseband processor) and an antenna 106. The transmission chain 102 is configured to provide a modulated signal to the antenna 106 for transmission using a number of subcarriers (e.g., resource blocks) comprised within a channel bandwidth. In one embodiment, the transmission chain 102 is configured to comprise an RF signal generation block 108, which generates a modulated RF signal using a modulation scheme, and a power amplifier 110, which increases the power of the modulated RF signal.

In the second signal path, one or more characteristics of the transmitted signal's modulation scheme are provided to a control circuit 112. In various embodiments, the characteristics of a transmitted signal's modulation scheme may comprise a number of subcarriers or resource blocks used for transmission, a frequency of the subcarriers or resource blocks, a bandwidth of the transmission, and any combination thereof.

In one particular embodiment, the characteristics of a modulation scheme may comprise a number of subcarriers and a channel bandwidth used in the transmission chain 102. In such an embodiment, the number of subcarriers and a channel bandwidth used in the transmission chain 102 are provided to a control circuit 112 (e.g., by the baseband processor). Upon receiving the number of subcarriers and/or channel bandwidth the control circuit 112 is configured to select one or more predetermined bias voltage(s) (e.g., a supply voltage and/or a quiescent voltage) associated with the number of subcarriers and/or channel bandwidth. The control circuit 112 is further configured to provide the predetermined bias voltage(s) to the power amplifier 110 to adjust its operating point to an optimized state that reduces the current consumption of the power amplifier 110.

In one embodiment, the predetermined bias voltage(s) (e.g., supply voltage and/or quiescent voltage) is chosen based upon an adjacent channel leakage ratio (ACLR) that is calculated from the number of subcarriers and/or channel bandwidth. If the number of subcarriers and/or channel bandwidth indicate a better ACLR performance is present than is needed the output power capabilities of a power amplifier can be reduced by reducing a supply voltage and/or a quiescent voltage that are supplied to the power amplifier 110. Therefore, the supply voltage and/or quiescent voltage may be chosen to reduce the current consumption of a power amplifier 110 to a minimum value that ensures an ACLR value that meets system requirements (e.g., a sufficient ACLR target value).

In one embodiment, the predetermined supply voltage may be stored in a memory 114 (e.g., RAM, ROM, flash, etc.) having a plurality of predetermined bias voltages (e.g., supply voltages, quiescent voltages, etc.) that respectively correspond to various combinations of a channel bandwidth and/or a number of subcarriers (e.g., resource blocks). In such an embodiment, upon receiving a number of subcarriers and/or channel bandwidth from the signal generator 104 the control circuit 112 is configured to select one or more associated predetermined bias voltage(s), calculated to optimize the current consumption of the power amplifier, from the memory 114 and provide the predetermined bias voltage(s) to the power amplifier 110.

Therefore, as shown in FIG. 1, a transmitter 100 is configured to optimize operation of a power amplifier 110 by having a control circuit 112 configured to provide one or more predetermined bias voltage(s), based upon one or more characteristics of the transmitted signal's modulation scheme (e.g., the number of subcarriers and/or channel bandwidth), to a power amplifier 110 to reduce the current consumption of the power amplifier 110.

Figure 2:
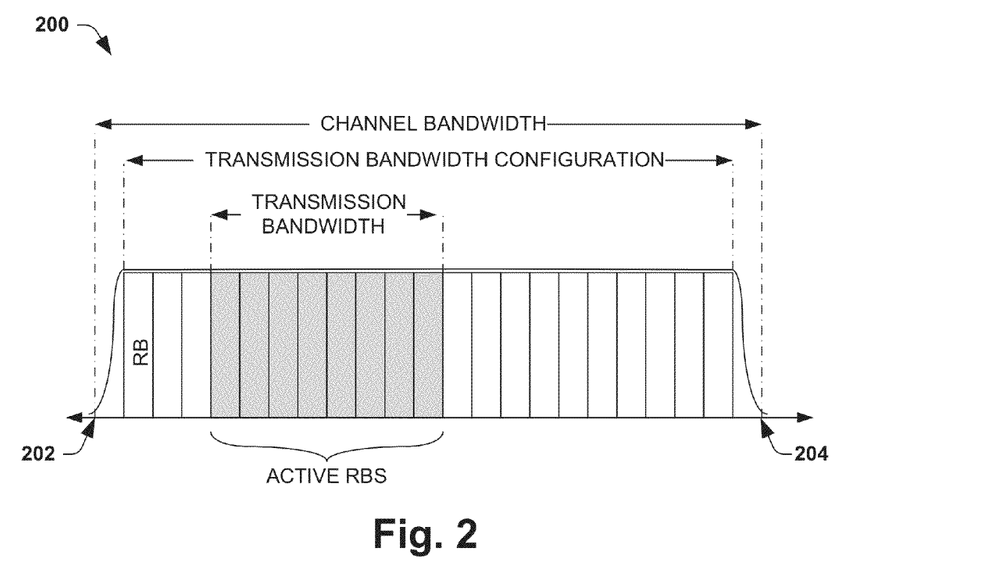
FIG. 2 is a block diagram of a typical variable bandwidth frequency structure.
Figure 3A:
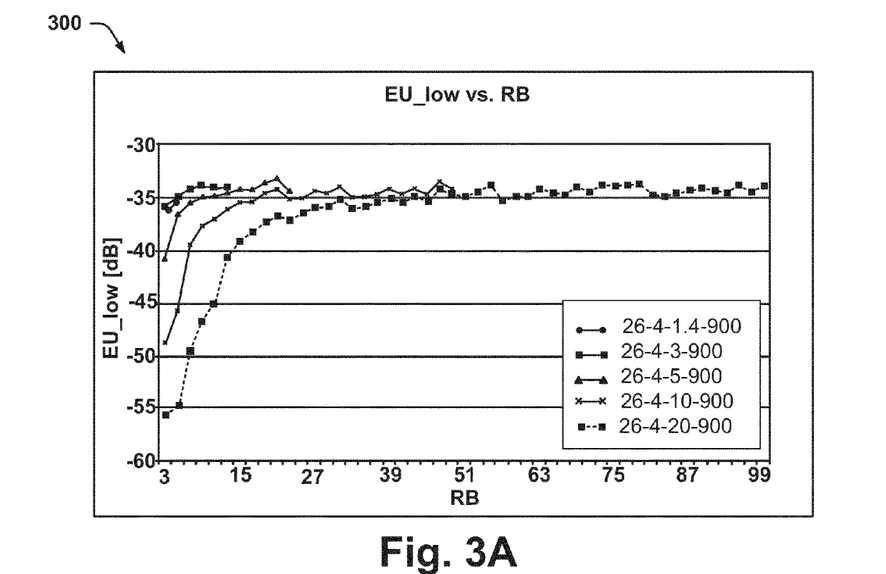
FIGS. 3A-3B show graphs of the ACLR as a function of the number of resource blocks and channel bandwidth used in a transmission for an LTE standard.
Figure 3B:
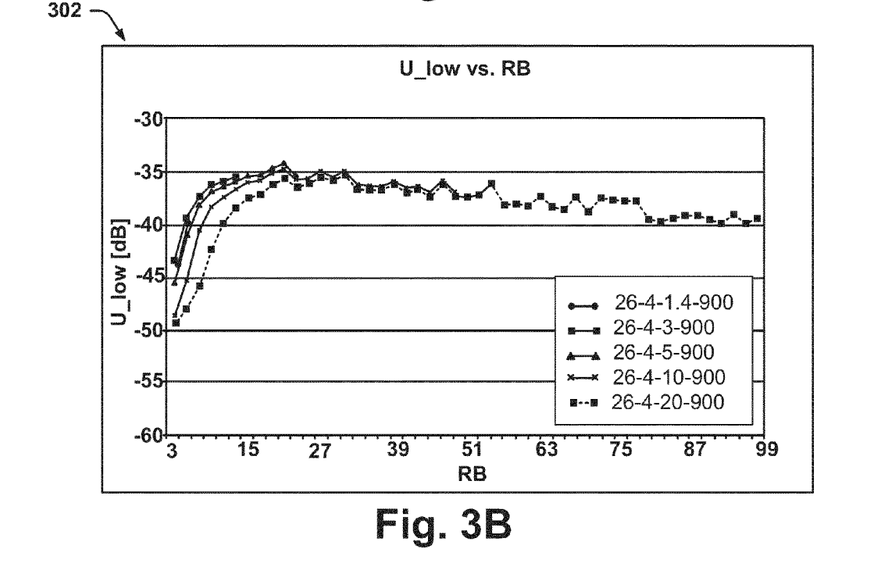
Figure 4:
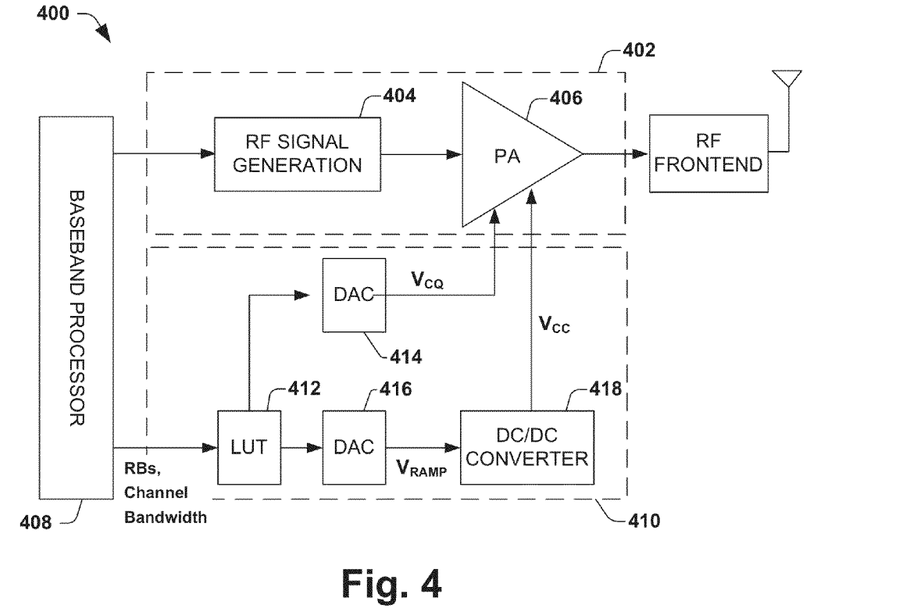
FIG. 4 illustrates a block diagram of a transmitter configured to optimize its current consumption by applying a predetermined bias voltage(s) based on an estimated ACLR.

FIGS. 2-4 illustrate a more detailed example of a transmitter, as provided herein, in the context of a particular embodiment wherein the method and apparatus are applied to a long term evolution (LTE) communication system. It will be appreciated that the application of the method and apparatus to a LTE system, as shown in FIGS. 2-4, is a non-limiting example of the present invention that is intended to aid in a reader's understanding. One skilled in the art will be appreciated that the method and apparatus (e.g., the transmitter described in FIG. 4) may be used with a variety of different modulation schemes.

LTE is a next generation standard for mobile wireless broadband technology that may provide data transfer rates up to 100 Mbits/s. To achieve such data transfer rates LTE may utilize a UMTS terrestrial radio access (UTRA) or an evolved UMTS terrestrial radio access (E-UTRA) air interface based upon a variable bandwidth modulation scheme such as orthogonal frequency division multiplexing (OFDM) modulation method or single carrier FDMA (SCFDMA), for example.

FIG. 2 illustrates a block diagram 200 of a typical variable bandwidth frequency structure. The channel bandwidth, the transmission bandwidth configuration, the transmission bandwidth, and resource blocks are shown in FIG. 2 with respect to frequency (spanning horizontally across the bottom of the block diagram). A channel bandwidth is a frequency range that is between RF channel edges 202 and 204, which are the lowest and highest frequencies of a carrier. The transmission bandwidth configuration, or the highest transmission bandwidth allowed for uplink or downlink in a given channel bandwidth, is about 90% of the channel bandwidth due to decaying side lobes. The transmission bandwidth is the bandwidth of an instantaneous transmission from a user equipment (UE) or base station (BS), measured in resource block units. A resource block (RB) is the smallest addressable unit and is comprised of a plurality of subcarriers, each having bandwidth of 15 kHz. A RB physically occupies 0.5 ms (1 slot) in the time domain and 180 kHz (16 subcarriers) in the frequency domain, although the number of subcarriers per RB and the number of symbols per RB may vary as a function of the cyclic prefix length and subcarrier spacing.

Variable bandwidth modulation schemes use a variable number of resource blocks (RBs) to transmit a signal depending on the channel bandwidth. In general, for larger channel bandwidths more RBs are used. In variable bandwidth modulation schemes the number of resource blocks used to a transmission may comprise any number of resource blocks within a channel bandwidth. For example, a 20 MHz channel bandwidth has a maximum 100 resource blocks that may be used over the full allocated bandwidth. However, a smaller number of resource blocks (e.g., 10 or 20 resource blocks) may be used for a transmission bandwidth that is less than the channel bandwidth (i.e., the maximum allocated bandwidth). In general, a number of subcarriers/resource blocks is associated with the instantaneous effective bandwidth of a modulation scheme while the channel bandwidth is associated with the maximum bandwidth of the modulation scheme.

During modulation using a variable bandwidth modulation scheme out of band emissions are typically generated. Out of band emissions are emissions on a frequency or frequencies immediately outside the transmission bandwidth that result from a modulation process. Adjacent channel leakage ratio (ACLR) is the ratio of the integrated signal power in adjacent or out of band channels to the integrated signal power in the main channel (e.g., at ±5 MHz and ±10 MHz offsets from the uplink channel). Practically, ACLR is calculated as the ratio of the transmitted power to the power measured after a receiver filter in the adjacent channel(s).

FIGS. 3A and 3B show graphs of the ACLR as a function of the number of resource blocks and channel bandwidth used in a transmission for an LTE standard. In LTE systems, ACLR error comprises two different ACLR error definitions, UTRA ACLR error (FIG. 3A) and E-UTRA ACLR error (FIG. 3B). UTRA ACLR error is defined to secure co-existence with wide band CDMA. E-UTRA ACLR error is ACLR error for single channel FMDA (SCFMDA). An LTE transmission system satisfies the target values of ACLR error in both UTRA and E-UTRA The inventors have appreciated that the ACLR of a power amplifier within a LTE transmitter is a function of the number of RBs and the channel bandwidth of used by the LTE transmitter. Based upon this appreciation the method and apparatus provided herein may rely upon the number of RBs and channel bandwidth of the LTE system to select a predetermined bias voltage(s) that can be used to adjust the ACLR of a power amplifier to a point that is within system specifications. Therefore, a transmitter circuit can adjust its power amplifier accord to one or more predetermined bias voltage(s) (e.g., supply voltage, quiescent voltage), calculated based upon a transmitted signal's number of resource blocks and/or channel bandwidth, to optimize the current consumption of a power amplifier.

In particular, FIG. 3A illustrates a graph 300 of the ACLR of an E-UTRA air interface (y-axis) versus the number of resource blocks (x-axis) for five different channel bandwidths: 1.4 MHz, 3 MHz, 5 MHz, 10 MHz, and 20 MHz (Legend of FIG. 3A denotes the bandwidth of each series line; e.g., circular markers are associated with 1.4 MHz, square markers with 3 MHz, triangular markers with 5 MHz, etc.). As shown in graph 300, the ACLR increases as the channel bandwidth decreases. For example, a signal transmitted over a 20 MHz bandwidth has a better ACLR than a signal transmitted over a 10 MHz bandwidth. Furthermore, as the number of resource blocks used to transmit a signal increases the ACLR increases. Therefore, from graph 300 it can be seen that ACLR error performance depends on both the channel bandwidth and the number of resource blocks and that ACLR performance is better for a low number of resource blocks and gets even better for a high channel bandwidth.

FIG. 3B illustrates a similar trend for a UTRA air interface. FIG. 3B illustrates a graph 302 of the ACLR of an UTRA air interface (y-axis) versus the number of resource blocks (x-axis) for five different channel bandwidths: 1.4 MHz, 3 MHz, 5 MHz, 10 MHz, and 20 MHz (Legend of FIG. 3B denotes the bandwidth of each series line; e.g., circular markers are associated with 1.4 MHz, square markers with 3 MHz, triangular markers with 5 MHz, etc.). FIG. 3B also illustrates that ACLR performance is better for a low number of resource blocks and gets even better for a high channel bandwidth.

Since the main source of adjacent channel leakage is the non-linear performance of a power amplifier (e.g., high signal power peaks that drive the power amplifier briefly into its non-linear operating region) a reduction in the ACLR of a transmission system is indicative of the linear performance of a power amplifier. This relationship between ACLR and linearity can be used to optimize the operating point of a power amplifier. For example, a good ACLR error performance (e.g., an ACLR error performance better than a transmission standard) indicates that the maximum linear output power capability of a power amplifier can be lowered to reduce the output power capability and current consumption. Alternatively, a bad ACLR error performance (e.g., an ACLR error performance worse than a transmission standard) indicates that the linear output power capabilities are insufficient and that the power amplifier current consumption should be increased.

FIG. 4 illustrates a more detailed block diagram of a transmitter 400 configured to optimize its current consumption by providing one or more predetermined bias voltage(s) to a power amplifier based on an estimate of ACLR calculated from a number of resource blocks and/or a channel bandwidth used to transmit a signal. The transmitter 400 comprises a first signal path configured to produce a modulated signal to an antenna and a second signal path generate and provide a predetermined supply voltage to a power amplifier in the first signal path.

As shown in FIG. 4, the first signal path comprises a transmission chain 402 having a RF signal generator 404 and a power amplifier 406. The power amplifier 406 has three inputs: one configured to receive a modulated RF signal to be transmitted, one configured to receive a supply voltage ($V_{CC}$), and one configured to receive a quiescent voltage ($V_{CQ}$). In one embodiment, wherein the power amplifier 406 comprises a heterojunction bipolar transistor (HBT) power amplifier the supply voltage controls the collector current of the HBT and the quiescent voltage controls the base current of the transistor.

In the second signal path, a baseband processor 408 provides the number of RBs and channel bandwidth used to transmit a signal in the first transmission path to a control circuit 410. The control circuit 410 comprises a lookup table (LUT) 412. The LUT 412 is configured to store a plurality of predetermined bias voltage values that respectively correspond to various combinations of a channel bandwidth and/or a number of resource blocks.

Figure 5:
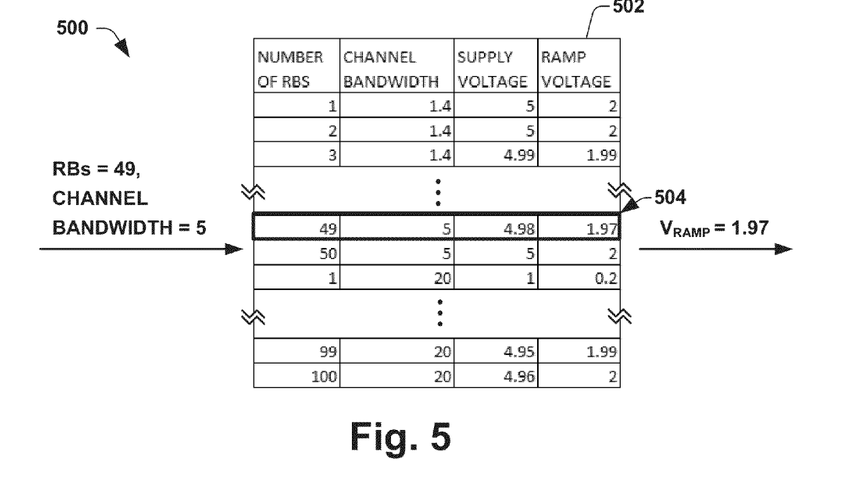
FIG. 5 illustrates an exemplary embodiment of a lookup table data path for a power efficient transmitter provided herein.

FIG. 5 illustrates an exemplary embodiment of a lookup table data path 500 (e.g., corresponding to LUT 412) for a power efficient transmitter. The LUT data path comprises a bus wire configured to provide a number of RBs and a channel bandwidth to a LUT 502. The LUT 502 comprises a plurality of rows, each row configured to store a supply voltage value and a quiescent voltage value corresponding to a particular combination of a number of RBs and a channel bandwidth. For example, a combination of 49 RBs and a channel bandwidth of 5 MHz corresponds a first supply voltage value of 4.98 V and a first quiescent voltage value of 1.97 V stored in the LUT. A different combination of 1 RB and a channel bandwidth of 20 MHz corresponds to a second supply voltage value of 1V and a second quiescent voltage value of 0.2 V stored in the LUT. As shown in FIG. 5, the received number of RBs equal to 49 and a channel bandwidth equal to 5 MHz are associated with a row 504 of the LUT. A voltage value of 1.97 V is output from row 504 and provided as a ramp voltage to a DAC (e.g., DAC 416) via a bus wire.

In one embodiment, the bias voltages stored in the LUT may be derived during product development (e.g., during development of the transmitter design and/or the design of the integrated chips used in the transmitter). In such an embodiment, optimized bias voltage(s) are determined for each combination of number of RBs and channel bandwidth outside of the transmitter. The optimized bias voltage may be determined using data collection, simulations, calculations, or some combination thereof. The optimized bias voltage(s) are then stored in the LUT.

The LUT may be configured to provide a plurality of output signals. As shown in FIG. 4, LUT 412 is configured to provide two output signals. The first output signal is a digital quiescent voltage that is provided to a digital-to-analog converter 414 configured to converts the digital quiescent voltage to an analog quiescent voltage $V_{CQ}$. The analog quiescent voltage $V_{CQ}$ is provided to the power amplifier 406 to set an operating point of the power amplifier. The second output signal is a digital ramp voltage that is provided to a digital-to-analog converter 416 configured to convert the digital ramp voltage to an analog ramp voltage $V_{RAMP}$. The analog ramp voltage $V_{RAMP}$ is an output voltage of DAC 416 that controls the output of the DC-to-DC converter 418. The analog ramp voltage $V_{RAMP}$ is provided to a DC-to-DC converter 418, which is configured to output a supply voltage $V_{CC}$ to the power amplifier 406 based upon the ramp voltage. There is typically a linear relationship between the input and output voltage of the DC-to-DC converter. For example, the supply voltage $V_{CC}$ may be 2.5 times larger than the ramp voltage $V_{RAMP}$.

It will be appreciated that the transmitters provided herein (e.g., corresponding to transmitters 100 and 400) are able to dynamically control the bias voltage(s) of a power amplifier over time for varying signal transmissions. For example, in transmitter 400, the control circuit 410 is able to dynamically vary the bias voltage(s) as the number of resource blocks and/or bandwidth used for transmission changes over a plurality of time slots.

Figure 6:
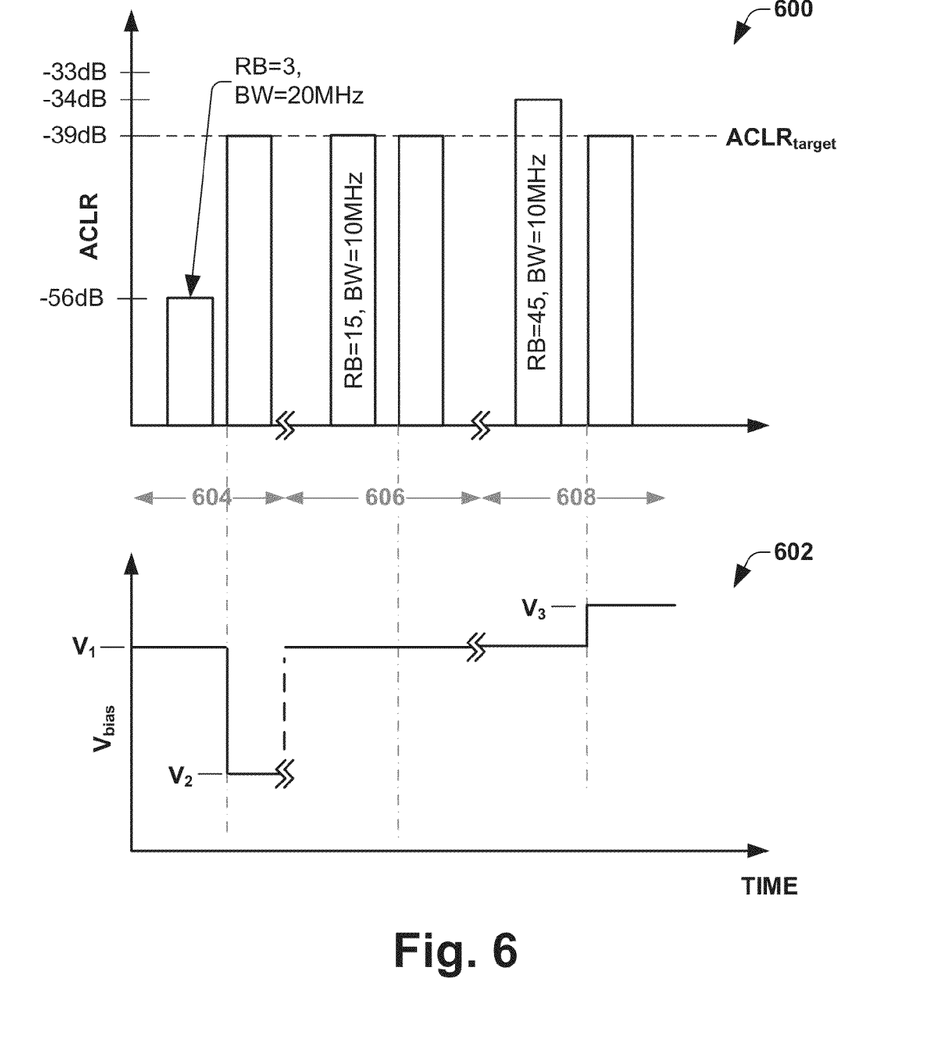
FIG. 6 illustrates a graph showing how a transmitter can dynamically control a supply voltage for varying transmissions using a different number of RBs and channel bandwidth.

FIG. 6 illustrates two graphs 600 and 602 showing how a transmitter can dynamically control a supply voltage for varying transmissions using a different number of RBs and channel bandwidth. In particular, FIG. 6 shows a graph of an estimated ACLR 600 (e.g., based upon the number of subcarriers/resource blocks and/or bandwidth) and an associated supply voltage 602 for different time slots (604, 606, 608). In each time slot the supply voltage can be varied to different values to dynamically adjust the current consumed in a power amplifier and therefore reduce the overall power consumption of the transmitter circuit.

More particularly, in a first time slot 604 a transmission using 3 RBs and a bandwidth of 20 MHz corresponds to an estimated ACLR of −56 dB. Since −56 dB is better than the target value of −39 dB for ACLR, once the control circuit receives the number of resource blocks and bandwidth it can reduce the supply voltage provided to the power amplifier from $V_1$ to $V_2$ and thereby optimize the current consumed by the power amplifier at a reduced current consumption.

In a second time slot 606 the transmission characteristics have changed to use different number of resource blocks and channel bandwidth. At the second time slot 606 the transmission uses 15 RBs and a bandwidth of 10 MHz, resulting in an estimated ACLR of −39 dB. Since −39 dB is equal to the target value for ACLR error, once the control circuit receives the number of resource blocks and bandwidth it can maintain the supply voltage being provided to the power amplifier at a value of $V_1$ and thereby optimize the current consumption of the power amplifier.

At a third time slot 608 the transmission characteristics have changed again to use a different number of resource blocks and channel bandwidth. At the third time slot 608 the transmission uses 45 RBs and a channel bandwidth of 10 MHz, resulting in an estimated ACLR of −34 dB. Since −34 dB is worse than the target value for ACLR, once the control circuit receives the number of resource blocks and bandwidth it can increase the supply voltage being provided to the power amplifier from $V_1$ to a value of $V_3$ to allow for sufficient transmission quality of the transmitted signal.

As stated above, the ACLR performance is typically very good for a transmission using a low number of resource blocks and a high channel bandwidth (e.g., LTE-20 is better than LTE-10 in FIGS. 3A and 3B). This is because of the frequency gap between the occupied bandwidth and the frequency where the ACLR measurement starts. For example, the frequency gap depends on the channel bandwidth and is different between E-UTRA ACLR error and UTRA ACLR error. For LTE-3 the frequency gap is 300 kHz for E-UTRA ACLR and 730 kHz for UTRA ACLR. For LTE-20 the frequency gap is 2 MHz for E-UTRA ACLR and 1.58 MHz for UTRA ACLR. Therefore, the ACLR performance for low numbers of RB is improved over the ACLR performance for a high number of RBs since the IP3 contribution from PA is not captured by the ACLR measurement.

Figure 7:
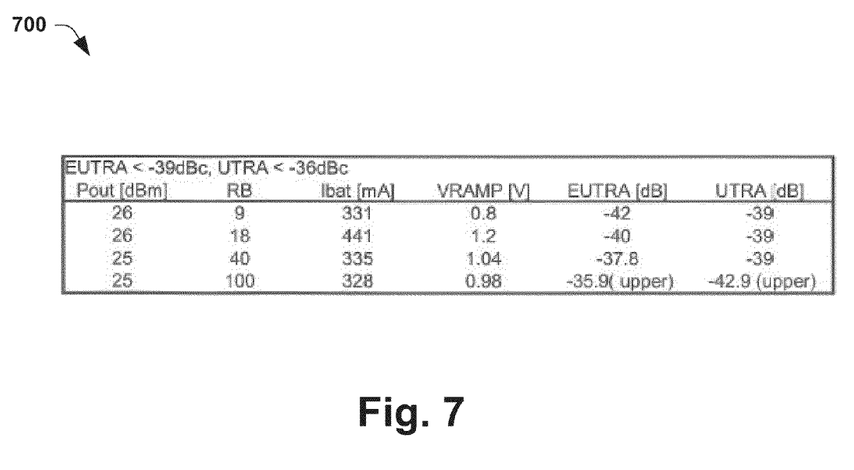
FIG. 7 illustrates a table showing achievable current savings for a LTE-20 QPSK transmission for a varying number of RBs.

FIG. 7 illustrates a table 700 showing achievable current savings for a LTE-20 (a constant bandwidth of 20 MHz) QPSK transmission (e.g., corresponding to FIGS. 3A and 3B) for a varying number of RBs. In particular, the table 700 shows for an output power of 26 dBm at the output of a power amplifier, the battery current, the ramp voltage (control voltage of a DC-to-DC converter), the E-UTRA ACLR, and the UTRA ACLR for 9, 18, 40, and 100 RBs.

In the first row a transmission using 9 RBs has a current consumption of 331 mA. Furthermore, the use of 9 RBs results in an E-UTRA ACLR error of −42 dB and an UTRA ACLR error of −39 dB. The E-UTRA ACLR of −42 dB is better than target value of −36 dB for E-UTRA. The UTRA ACLR of −39 dB is the same as the target value of −39 dB for UTRA. Therefore, since the UTRA ACLR error is the same as the target value, while the E-UTRA ACLR error is better than the target value, the UTRA ACLR error controls the bias point of a power amplifier.

In next row a transmission using 18 RBs has a current consumption of 441 mA. The use of 18 RBs results in an E-UTRA ACLR error of −40 dB and a UTRA error of −39 dB. Since as above, the UTRA ACLR error is equal to the target value, while the E-UTRA ACLR error is better than the target value, the UTRA target still controls the bias point of the PA and a current of 441 mA is used.

However, taking into consideration the number of resource blocks allows for a change in the bias voltage(s) for a transmission using 9 RBs (first row) to use a smaller current. By lowing the bias voltage(s) based on the number of RBs, 110 mA of current can be saved when 9 RBs are used for a transmission. Similar a current saving of 106 mA can be achieved when 40 RB are used for a transmission and a current savings of 113 mA can be achieved when 100 RB are used for a transmission.

Figure 8:
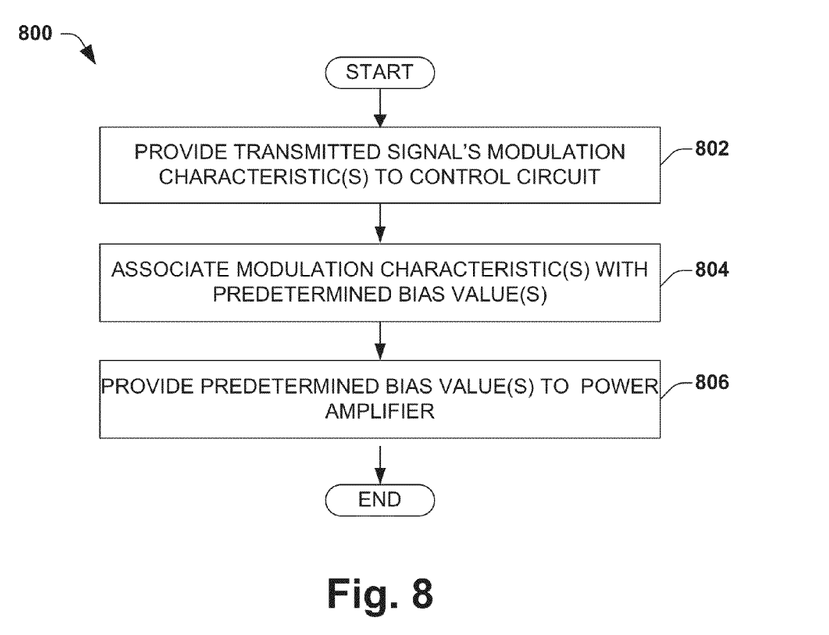
FIG. 8 illustrates a flow diagram of an exemplary method that may be used to dynamically adjust an operating point of a transmission chain element in a stepwise manner.

FIG. 8 illustrates a flow diagram of an exemplary method 800 that may be used (e.g., operated by a control circuit) to dynamically adjust an operating point of a transmission chain element in a stepwise manner. The method drives the operating point to a value that is close to a predetermined threshold so that a transmission chain is optimized for both low current and good transmission.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 802 one or more characteristics of the transmitted signal's modulation scheme are provided to a control circuit. The characteristics of the modulation scheme may comprise a number of subcarriers in one embodiment. In various other embodiments, the characteristics of a transmitted signal's modulation scheme may comprise a number of subcarriers or resource blocks used for transmission, a frequency of the subcarriers or resource blocks, a bandwidth of the transmission, and any combination thereof.

The one or more characteristics of the transmitted signal's modulation scheme are associated with a predetermined bias voltage value(s) at 804. The predetermined bias voltage value(s) may be determined to correspond to characteristics of a transmitted signal's modulation scheme from calibration performed of the system prior to transmission. For example, the predetermined bias voltage value(s) may correspond to various combinations of a number of subcarriers and/or a channel bandwidth. In one embodiment, the predetermined bias voltage value(s) may be determined using data collection, simulations, calculations, or some combination thereof. The optimized bias voltage(s) are then stored in the LUT.

In one embodiment, the predetermined supply voltage is particularly chosen based upon an adjacent channel leakage ratio that is calculated from the number of subcarriers and/or channel bandwidth. The supply voltage may be chosen to reduce the collector current of a power amplifier to a minimum value that ensures an ACLR value that meets system requirements. In other words, because different subcarrier numbers and channel bandwidths output different ACLR values, a bias voltage may be chosen to optimize the power amplifier current and to ensure a sufficient ACLR target value. If the number of RBs and bandwidth indicate a better ACLR performance then needed the output power capabilities can reduce output power capability of a power amplifier, can reduce supply voltage of the power amplifier causing a higher conversion ratio in a Dc-DC converter configured to supply the supply voltage to the power amplifier.

At 806 the predetermined bias voltage value(s) are provided to a power amplifier to adjust the operating point of the power amplifier to have a current consumption is optimized to minimize current. For example, in one embodiment if the one or more characteristics indicate a good power amplifier performance the maximum linear output power capability of a power amplifier can be lowered to reduce the output power capability and current consumption. Alternatively, if the one or more characteristics indicate a bad power amplifier performance the power amplifier current consumption should be increased.

It will be appreciated that the term amplifier, as referred to in this disclosure and shown in the associated figures is meant to encompass one or more amplifiers. For example, an amplifier may refer to more than one transistor amplifier consisting of several stages with matching networks. The inventors have contemplated the use of the disclosed invention with the use of a wide variety of amplifiers. Furthermore, although the examples provided herein are described in regards transmitter circuits, it will be appreciated that the invention may be broadly applied to different transceiver and/or transmitter architectures.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transmission circuit, comprising:
a first transmission path extending between a signal generator and an antenna port, wherein the transmission path is configured to provide a modulated signal to the antenna port for transmission using a modulation scheme;
a power amplifier, comprised within the first transmission path, configured to receive one or more bias voltages that vary the power amplifier's current consumption;
a control circuit configured to provide one or more bias voltages to the power amplifier, wherein the one or more bias voltages are determined based upon one or more variable characteristics within the modulation scheme to have a value that optimizes the power amplifier's current consumption;
wherein the one or more variable characteristics within the modulation scheme comprise a number of resource blocks determining the instantaneous effective bandwidth of the modulation scheme and a channel bandwidth which determines the maximum bandwidth; and
wherein the bias voltage is determined to optimize the power amplifier's current consumption based upon an adjacent channel leakage ratio (ACLR) calculated using the number of resource blocks and the channel bandwidth.

2. The transmission circuit of claim 1, wherein the signal generator comprises a baseband processor configured to provide the number of resource blocks and the channel bandwidth to the control circuit.

3. The transmission circuit of claim 1, wherein the one or more variable characteristics within the modulation scheme comprise a number of subcarriers.

4. The transmission circuit of claim 1, wherein the one or more bias voltages comprise a supply voltage.

5. The transmission circuit of claim 1, wherein the one or more bias voltages comprise a quiescent voltage.

6. The transmission circuit of claim 1, wherein the control circuit comprises a lookup table configured to store a plurality of values to determine bias voltages, wherein respectively bias voltages are associated with a particular set of characteristics within the modulation scheme.

7. The transmission circuit of claim 6, wherein the plurality of values to determine bias voltages stored in the lookup table are derived during development outside of the transmission circuit.

8. The transmission circuit of claim 1, wherein the transmitter circuit is configured to utilize a UMTS terrestrial radio access (UTRA) or an evolved UMTS terrestrial radio access (E-UTRA) air interface based upon orthogonal frequency division multiplexing (OFDM) modulation.

9. The transmission circuit of claim 1, wherein the control circuit is configured to dynamically vary the value of the one or more bias voltages while operating within the modulation scheme, as the one or more variable characteristics within the modulation scheme change, to optimize the power amplifier's current consumption.

10. A transmission circuit, comprising:
a first transmission path extending between a baseband processor and an antenna port, wherein the transmission path is configured to provide a modulated signal to the antenna port for transmission using a number of resource blocks which determine the instantaneous effective bandwidth of the modulation scheme and a channel bandwidth which determines the maximum bandwidth;
a power amplifier configured to receive one or more bias voltages that vary the power amplifier's current consumption;
a control circuit configured to
receive the number of resource blocks and the channel bandwidth from the baseband processor;
determine a bias voltage associated with the combination of a number of resource blocks and a channel bandwidth; and
provide one or more bias voltages to the power amplifier.

11. The transmission circuit of claim 10, wherein the bias voltages are determined to have values that optimize an estimated ACLR value, that is calculated from the a number of resource blocks and a channel bandwidth, to a minimum required value.

12. The transmission circuit of claim 11, wherein one or more of the bias voltages reduce the current consumption of a power amplifier if an ACLR error performance is better than a transmission standard; and wherein one or more of the bias voltages are configured to increase the current consumption of a power amplifier if an ACLR error performance is worse than a transmission standard.

13. The transmission circuit of claim 10, wherein one or more of the bias voltages comprise a ramp voltage or a quiescent voltage.

14. The transmission circuit of claim 13, wherein the ramp voltage is provided to a DC-to-DC converter configured to generate a supply voltage therefrom.

15. The transmission circuit of claim 10, wherein a plurality of bias voltages are derived during development outside of the transmission circuit.

16. A method for reducing current consumption of a transmission circuit, comprising:
receiving one or more variable characteristics within a signal-to-be-transmitted's modulation scheme;
selecting one or more bias voltages associated with the received one or more characteristics stored in a memory location;
providing one or more bias voltages to a power amplifier, wherein the one or more bias voltages are determined based upon the one or more variable characteristics within the modulation scheme to have a value that optimizes the current consumption of the power amplifier;
wherein the one or more variable characteristics within the modulation scheme comprise a number of resource blocks which determine the instantaneous effective bandwidth of the modulation scheme and a channel bandwidth which determines the maximum bandwidth; and
wherein the one or more bias voltages have a value selected to optimize the power amplifier's current consumption based upon an adjacent channel leakage ratio (ACLR) calculated using the number of resource blocks and the channel bandwidth.

17. The method of claim 16, wherein the one or more bias voltages comprises a supply voltage or a quiescent voltage.

18. The method of claim 16, wherein the memory location comprises a lookup table configured to store a plurality of bias voltages, wherein respective bias voltages are associated with a particular set of characteristics within the modulation scheme.

19. A transmission circuit, comprising:
a first transmission path extending between a signal generator and an antenna port, wherein the transmission path is configured to provide a modulated signal to the antenna port for transmission using a modulation scheme;
a control circuit configured to provide one or more bias voltages to a power amplifier to vary a current consumption of the power amplifier, wherein the one or more bias voltages are determined based upon one or more variable characteristics within the modulation scheme to have a value that optimizes the power amplifier's current consumption;
wherein the one or more variable characteristics within the modulation scheme comprise a number of resource blocks and a channel bandwidth, and wherein the one or more bias voltages have a value selected to optimize the power amplifier's current consumption based upon an adjacent channel leakage ratio (ACLR) calculated using the number of resource blocks and the channel bandwidth.

20. The transmission circuit of claim 19, wherein the control circuit is configured to dynamically vary the value of the one or more bias voltages while operating within the modulation scheme, as the one or more variable characteristics within the modulation scheme change, to optimize the power amplifier's current consumption.

* * * * *